United States Patent
Itou et al.

(10) Patent No.: US 6,787,859 B2
(45) Date of Patent: Sep. 7, 2004

(54) SEMICONDUCTOR MEMORY DEVICE WITH SHORTENED CONNECTION LENGTH AMONG MEMORY BLOCK, DATA BUFFER AND DATA BUS

(75) Inventors: Takashi Itou, Tokyo (JP); Masaki Shimoda, Tokyo (JP); Yasuhiko Tsukikawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/223,319

(22) Filed: Aug. 20, 2002

(65) Prior Publication Data

US 2003/0057500 A1 Mar. 27, 2003

(30) Foreign Application Priority Data

Sep. 25, 2001 (JP) ...................................... P2001-291681

(51) Int. Cl.⁷ ............................................... H01L 29/94
(52) U.S. Cl. ...................... 257/390; 257/288; 257/368; 365/185.11; 365/230.03
(58) Field of Search ................................ 257/390, 368, 257/288; 365/185.11, 230.03

(56) References Cited

U.S. PATENT DOCUMENTS

| | | | |
|---|---|---|---|
| 6,064,621 A | 5/2000 | Tanizaki et al. | 365/230.03 |
| 6,072,743 A | 6/2000 | Amano et al. | 365/230.03 |
| 6,215,720 B1 | 4/2001 | Amano et al. | 365/230.03 |
| 6,496,441 B2 * | 12/2002 | Kono et al. | 365/230.03 |
| 6,553,552 B1 * | 4/2003 | Khan et al. | 716/10 |

FOREIGN PATENT DOCUMENTS

| | | |
|---|---|---|
| JP | 11-203862 | 7/1999 |
| JP | 11-265573 | 9/1999 |

* cited by examiner

Primary Examiner—Nathan J. Flynn
Assistant Examiner—Scott R. Wilson
(74) Attorney, Agent, or Firm—McDermott, Will & Emery

(57) ABSTRACT

There is provided a semiconductor memory device including eight memory blocks 20a to 20h, first data bus 22a, and second data bus 22b. The eight memory blocks are arranged at respective eight of the total nine areas 11 to 19 defined in a three rows by three columns matrix except for a center area 19. A first data bus 22a linearly extends between memory blocks in the first and second row of the matrix. A second data bus 22b linearly extends between memory blocks in the second and third row of the matrix. The eight memory blocks includes a first group of the four memory blocks arranged adjacent the first data bus and connected to the first data bus and a second group of the four memory blocks arranged adjacent the second data bus and connected to the second data bus.

7 Claims, 9 Drawing Sheets

SEMICONDUCTOR MEMORY DEVICE WITH SHORTENED CONNECTION LENGTH AMONG MEMORY BLOCK, DATA BUFFER AND DATA BUS

BACKGROUND OF THE INVENTION

1. Field of the Invention

The present invention relates to a semiconductor memory device having a plurality of memory blocks and, more particularly, to a dynamic random access memory device having a plurality of banks including a plurality of memory blocks.

2. Description of the Background Art

A semiconductor memory device has been improved to increase its memory capacity. Particularly, the memory capacity of a dynamic random access memory device (hereinafter referred to as DRAM) has increased from 64 Mbits to 256 Mbits. In the process of improvement, a microfabrication technique has been developed to enable the memory capacity of a semiconductor package of a given chip size to be increased by a factor of four for the next generation DRAM. However, it takes a long time to develop the next generation DRAM and, accordingly, an attempt has been made to lay out a DRAM of an intermediate capacity, say, 128 or 512 MBits on the same assembly chip as that designed for 64 or 256 MBits such as disclosed in, for example, Japanese Laid-open Patent Publication No. 11-265573, and Japanese Laid-open Patent Publication No. 11-203862.

The semiconductor memory device disclosed in the publication No. 11-265573 has eight memory blocks arranged in a three rows by three columns matrix so as to occupy respective eight of the nine areas except for a center area. In the semiconductor memory device disclosed in the publication the No. 11-203862, a bank includes a pair of memory blocks and the memory blocks of the bank are arranged on sub-regions symmetrical about the center area or on the neighboring sub-regions.

SUMMARY OF THE INVENTION

There are several problems in order to provide the semiconductor memory device having eight memory blocks as mentioned above. Accordingly, we had done a series of studies to materialize the semiconductor memory device and have resulted in the present invention.

In accordance with one aspect of the present invention, there is provided a semiconductor memory device including eight memory blocks, a first data bus, and a second data bus. The eight memory blocks are arranged at respective eight of the total nine areas defined in a three rows by three columns matrix, except for a center area. A first data bus has a plurality of data lines and linearly extends between memory blocks in the first row of the matrix and memory blocks in the second row of the matrix. A second data bus has a plurality of data lines and linearly extends between memory blocks in the second row of the matrix and memory blocks in the third row of the matrix. The eight memory blocks includes a first group of the four memory blocks arranged adjacent the first data bus and connected to the first data bus and a second group of the four memory blocks arranged adjacent the second data bus and connected to the second data bus.

Preferably, the first data bus may be for the memory block associated with a lower data buffer, the second data bus may be for the memory block associated with an upper data buffer. The eight memory blocks may have two groups each including four memory blocks associated with the lower data buffer or upper data buffer. The first group is positioned adjacent the first data bus and connected to the first data bus, and the second group is positioned adjacent the second data bus and connected to the second data bus.

More preferably, the first data bus may be for the memory block having an even column address, and the second data bus may be for the memory block having an odd column address. The eight memory blocks may have two groups each including four memory blocks having the even or odd column address. The first group is arranged adjacent the first data bus and connected to the first data bus, and the second group is arranged adjacent the second data bus and connected to the second data bus.

Preferably, the semiconductor memory device may further include a first data buffer and a second data buffer. The first data buffer is arranged within the center area adjacent memory blocks in the first row of the matrix and connected to the first data bus. The second data buffer is arranged within the center area adjacent memory blocks in the third row of the matrix and connected to the second data bus.

More preferably, the semiconductor memory device may further include a first perpendicular bus and a second perpendicular bus. The first perpendicular bus extends perpendicular to a longitudinal direction of the second data bus, and is connected between the second data bus and the first data buffer. The second perpendicular bus extends perpendicular to a longitudinal direction of the first data bus, and is connected between the first data bus and the second data buffer.

Preferably each of the first and second data buses may include a data bus equalizer. Each of the first and second data buses may have a partially enlarged width and may have data lines partially spaced.

More preferably, the eight memory blocks include four banks each having a pair of memory blocks. The one memory block of the bank is connected to the first data bus, and the other memory block is connected to the second data bus. The eight memory blocks are arranged such that four line segments connected between a pair of memory blocks have no crossing, Further preferably, the semiconductor memory device may further include a row decoder associated with a memory block and a row controller for controlling the row decoder. The row controller is arranged within the center area adjacent the memory block.

Each pair of memory blocks of the bank may have a row controller for controlling the row decoder in common. The semiconductor memory device may further include a column decoder associated with a memory block and a column controller for controlling the column decoder. The column controller is arranged within the center area adjacent the memory block. Each pair of memory blocks of the bank may have a column controller for controlling the column decoder in common. A repeater circuit may be arranged between the column controller and the column decoder.

According to the semiconductor memory device of the present invention, the length of connection between the memory block and the data bus may be shortened, so that layout area may be reduced.

BRIEF DESCRIPTION OF THE DRAWINGS

The present invention will become readily understood from the following description of preferred embodiment thereof made with reference to the accompanying drawings, in which like parts are designated by like reference numeral and in which.

DETAILED DESCRIPTION OF THE PREFERRED EMBODIMENTS

Figure 1:
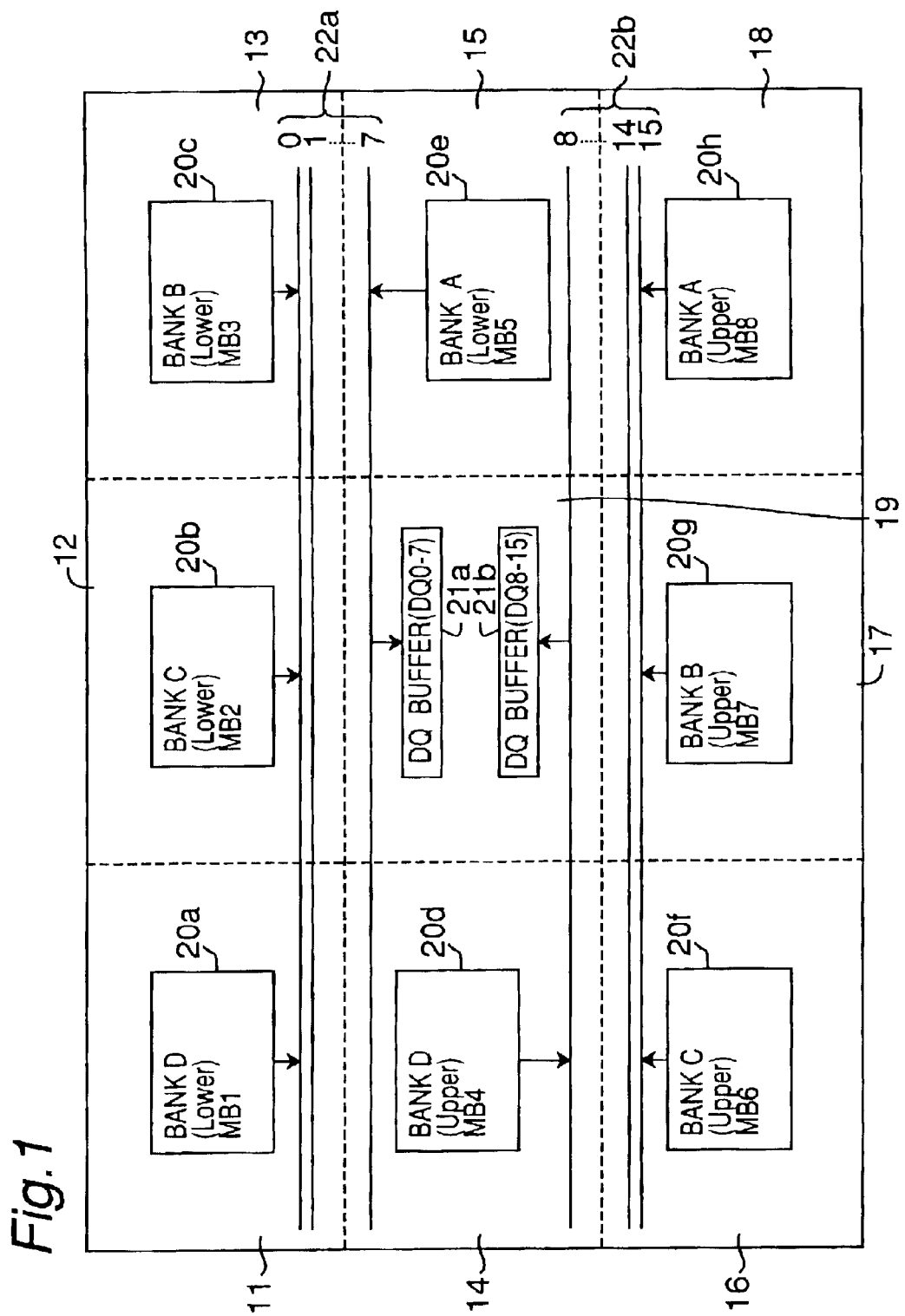
FIG. 1 is a schematic diagram showing the location of a memory cell array according to a first embodiment of present invention.
Figure 2:
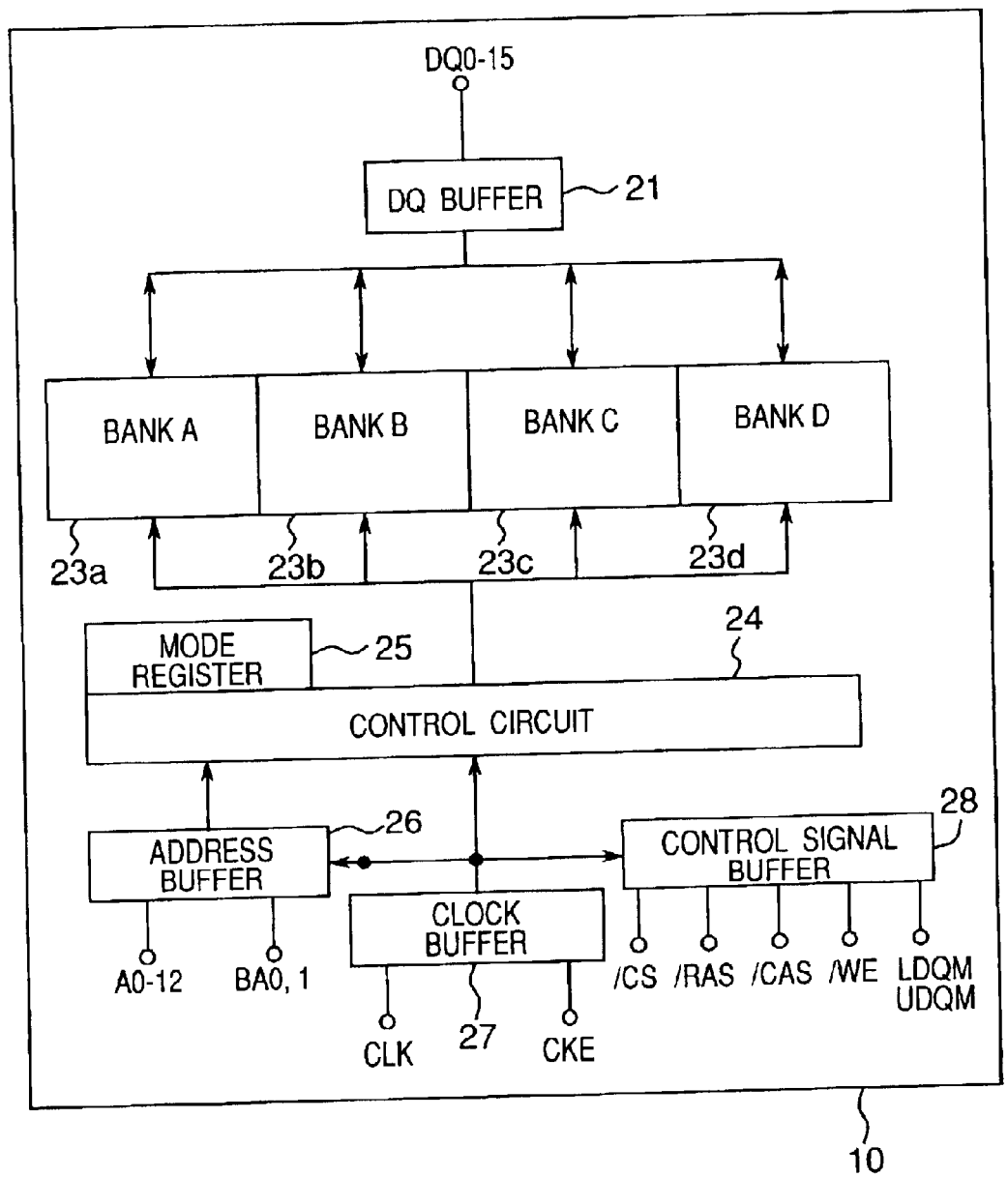
FIG. 2 is a block diagram with respect to data input/output of the first embodiment of present invention.

Referring to FIG. 1 and FIG. 2, a semiconductor memory device shown therein includes eight memory blocks 20a to 20h. Those eight memory blocks 20a to 20h are hereinafter referred to as MB1 to MB8, respectively, and are arranged at eight areas 11 to 18 around a center area 19 of the total nine areas that are defined in a three rows by three columns matrix. Each memory block 20a to 20h includes a memory cell array. The semiconductor memory device includes first and second data buffers, that is, a DQ buffer for data input/output on a lower side from zero to seven, and a DQ buffer for data input/output on a higher side from eight to fifteen. The DQ buffer on lower side is called as first data buffer. The DQ buffer on higher side is called as second data buffer. The first and second data buffers are arranged at center area 19. The semiconductor memory device also includes a first data bus 22a having a plurality of data lines for lower side. The first data bus 22a extends linearly between memory blocks MB1 to MB3 in the first row of the matrix and memory blocks MB4, MB5 in the second row of the matrix. The first data bus 22a is connected to the DQ buffer 21a on lower side. The semiconductor memory device also includes a second data bus 22b having a plurality of data lines for upper side. The second data bus 22b extends linearly between memory blocks MB4, MB5 in the second row of the matrix and memory blocks MB6 to MB8 in the third row of the matrix. The second data bus 22b is connected to the DQ buffer 21b on upper side. The four memory blocks MB1 to MB3, and MB5 are for input/output to the DQ buffer 21a, and are arranged adjacent both sides of the first data bus 22a. On the other hand, the four memory blocks MB4, and MB6 to MB8 are for input/output to the DQ buffer 21b, and are arranged adjacent both sides of the second data bus 22b. Hereby, the length of connection between the memory block and the data bus may be shortened, so that layout area may be reduced. Moreover, the DQ buffer 21a on lower side is arranged adjacent the first data bus 22a for lower side, and the DQ buffer 21b on upper side is arranged adjacent the second data bus 22b for upper side. Thereby data transfer speed may be enhanced so that the semiconductor memory device may have high performance.

Referring to FIG. 2, we will explain the component for data input/output of the semiconductor memory device. The semiconductor memory device includes four banks 23a to 23d as shown in FIG. 2. A control signal is input from an address buffer 26, a clock buffer 27, and a control signal buffer 28 to each bank 23a to 23d through a control circuit 24 and mode resister 25. Data input/output to each bank 23a to 23d is carried out through the DQ buffer 21. It is noted that the semiconductor memory device may operate on single data rate SDR.

Figure 3:
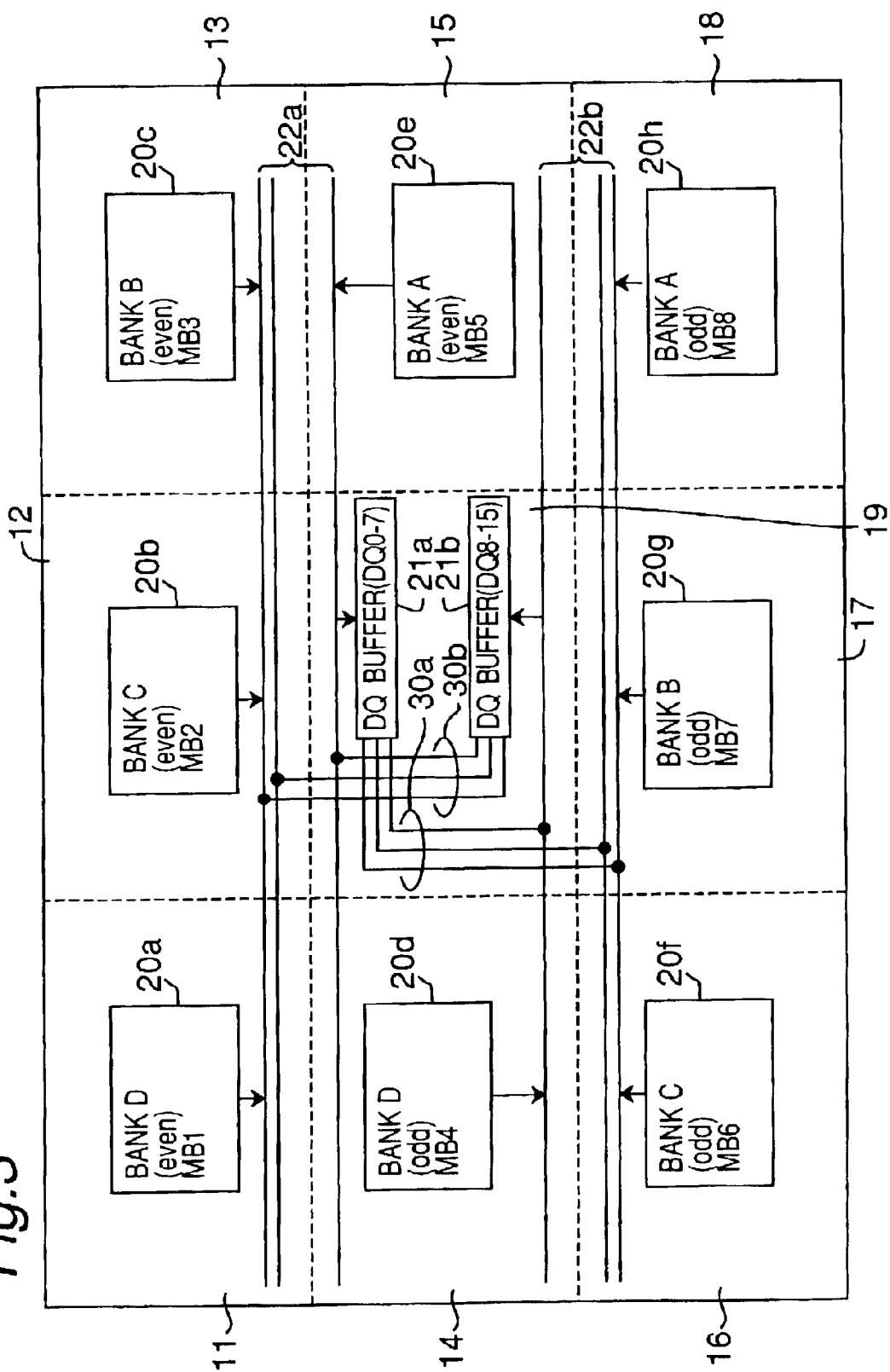
FIG. 3 is a schematic diagram showing the location of the memory cell array according to a second embodiment of present invention.
Figure 4:
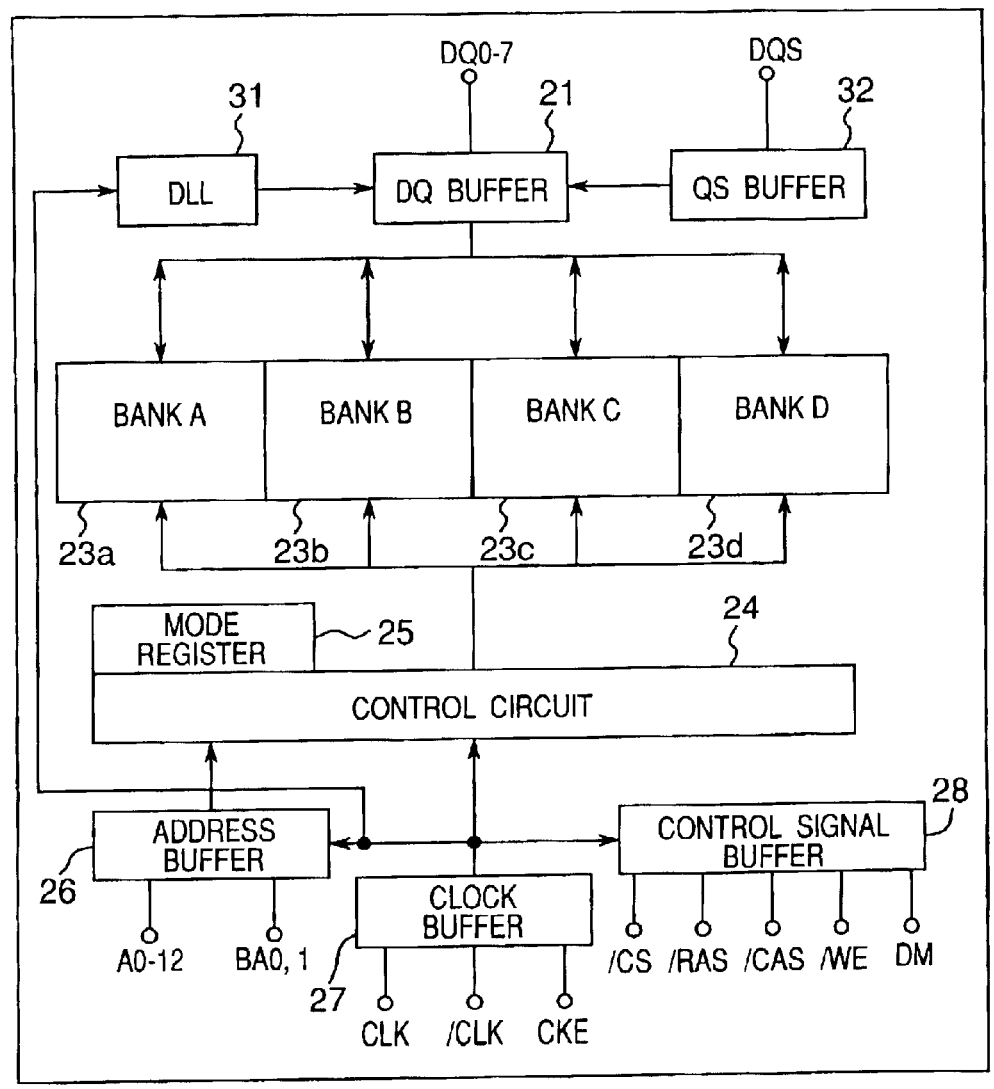
FIG. 4 is a block diagram, showing a data input/output in the second embodiment of present invention.

Referring to FIG. 3 and FIG. 4, we will explain the semiconductor memory device according to a second embodiment of the present invention. This semiconductor memory device is different from the semiconductor memory device of the first embodiment in that the first data bus 22a is for a memory block having an even column address, and the second data bus 22b is for a memory block having an odd column address as shown in FIG. 3. Further, the semiconductor memory device is different from the first embodiment in that the semiconductor memory device further includes a first perpendicular bus 30a and a second perpendicular bus 30b. The first and second perpendicular buses 30a, 30b are arranged within the center area 19. The first perpendicular bus 30a is perpendicular to the first and second data buses 22a, 22b and is connected between the DQ buffer 21a on lower side and the second data bus 22b. The second perpendicular bus 30a is perpendicular to the first and second data buses 22a, 22b and is connected between the DQ buffer 21b on upper side and the first data bus 22a. Hereby the semiconductor memory device, that is, a synchronous dynamic RAM may operate on double data rate DDR. Moreover, the first and second perpendicular buses 30a, 30b are arranged within the center area 19, so that the semiconductor memory device may have a reduced side length. In the semiconductor memory device, the four memory blocks MB1 to MB3, MB5 having an even column address are arranged adjacent both sides of the first data bus 22a. On the other hand, the four memory blocks MB4, MB6 to MB8 having an odd column address are arranged adjacent both sides of the second data bus 22b. Thereby, the semiconductor memory device may have a reduced side length so that a semiconductor memory device having compact layout area may be fabricated.

Referring to FIG. 4, we will explain a component for data input/output of the semiconductor memory device. The semiconductor memory device is different from the semiconductor memory device of the first embodiment in that the semiconductor memory device further includes a delayed-locked loop DLL 31 and QS buffer 32, which are arranged at data input side. The delayed-locked loop DLL 31 generates inner clock having a phase shift from outer clock.

Figure 5:
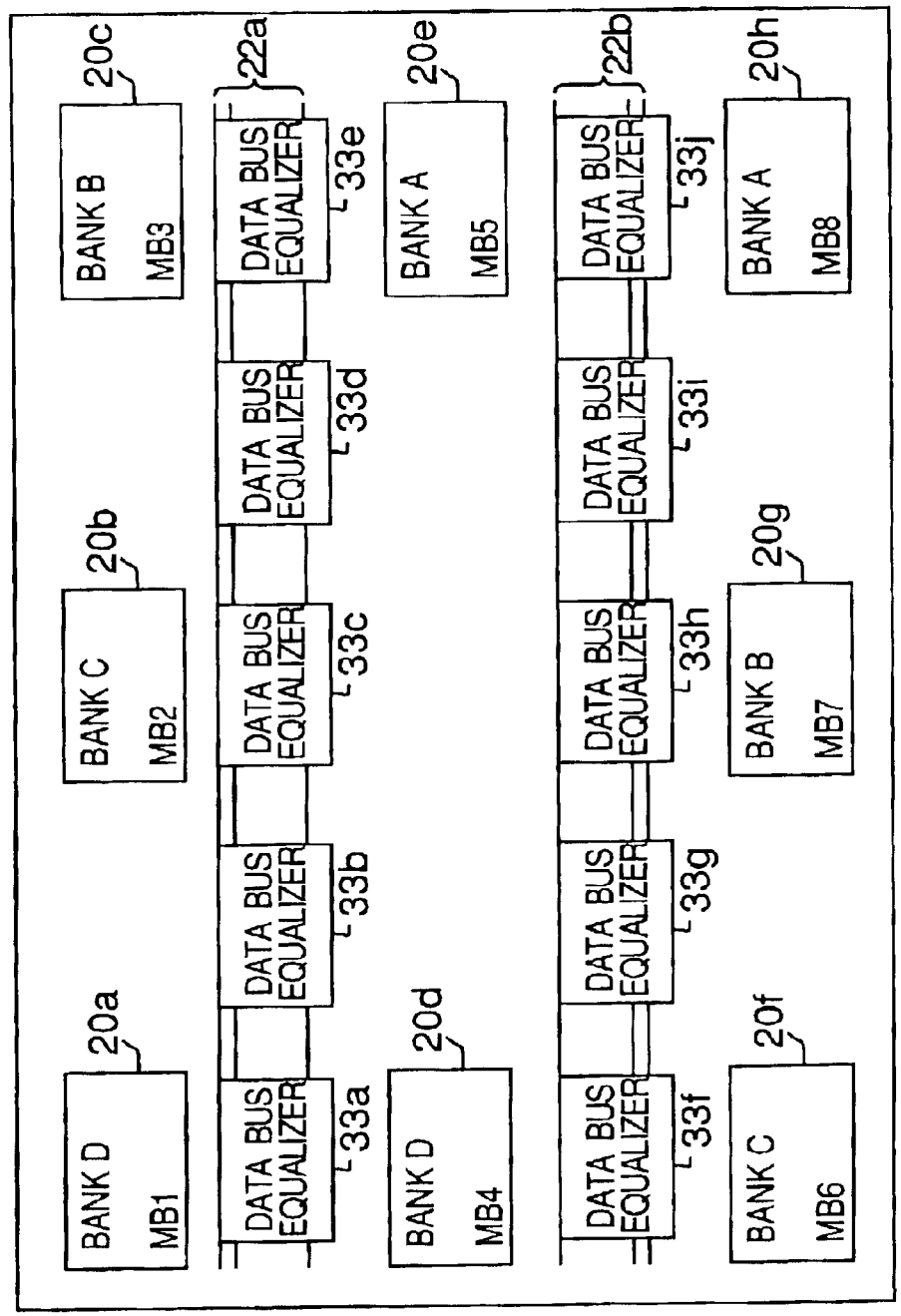
FIG. 5 is a schematic diagram showing the location of the memory cell array according to a third embodiment of present invention.
Figure 6:
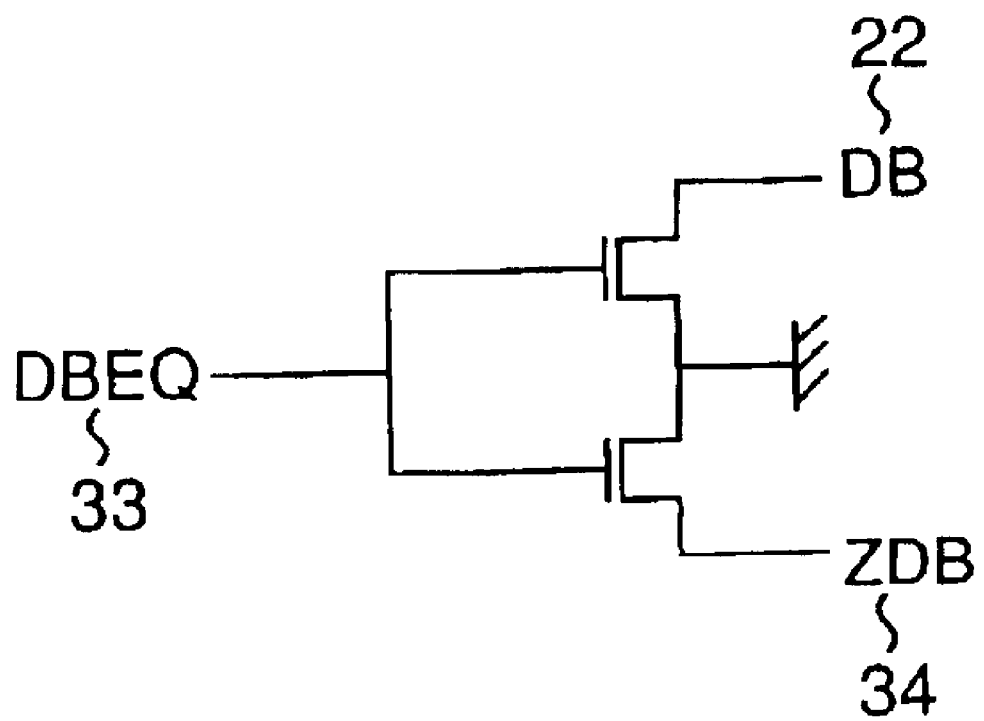
FIG. 6 is a circuit diagram of a data bus equalizer employed in the third embodiment of the present invention.

Referring to FIG. 5 and FIG. 6, we will explain a semiconductor memory device according to a third embodiment of the present invention. This semiconductor memory device includes the first and second data bus 22a, 22b each including a plurality of data bus equalizers 33 as shown in FIG. 5. A complementary bus 34 may be provided with respect to the data bus 22 in a data bus equalizer circuit 33 as shown in FIG. 6. Since the data bus equalizer circuit 33 can effectively equalize each data bus 22a, 22b, data transfer speed may be enhanced such that a high-performance semiconductor memory device may be provided. It is noted that the data bus equalizer circuit 33 may include another circuit component in place of the complementary bus.

Figure 7:
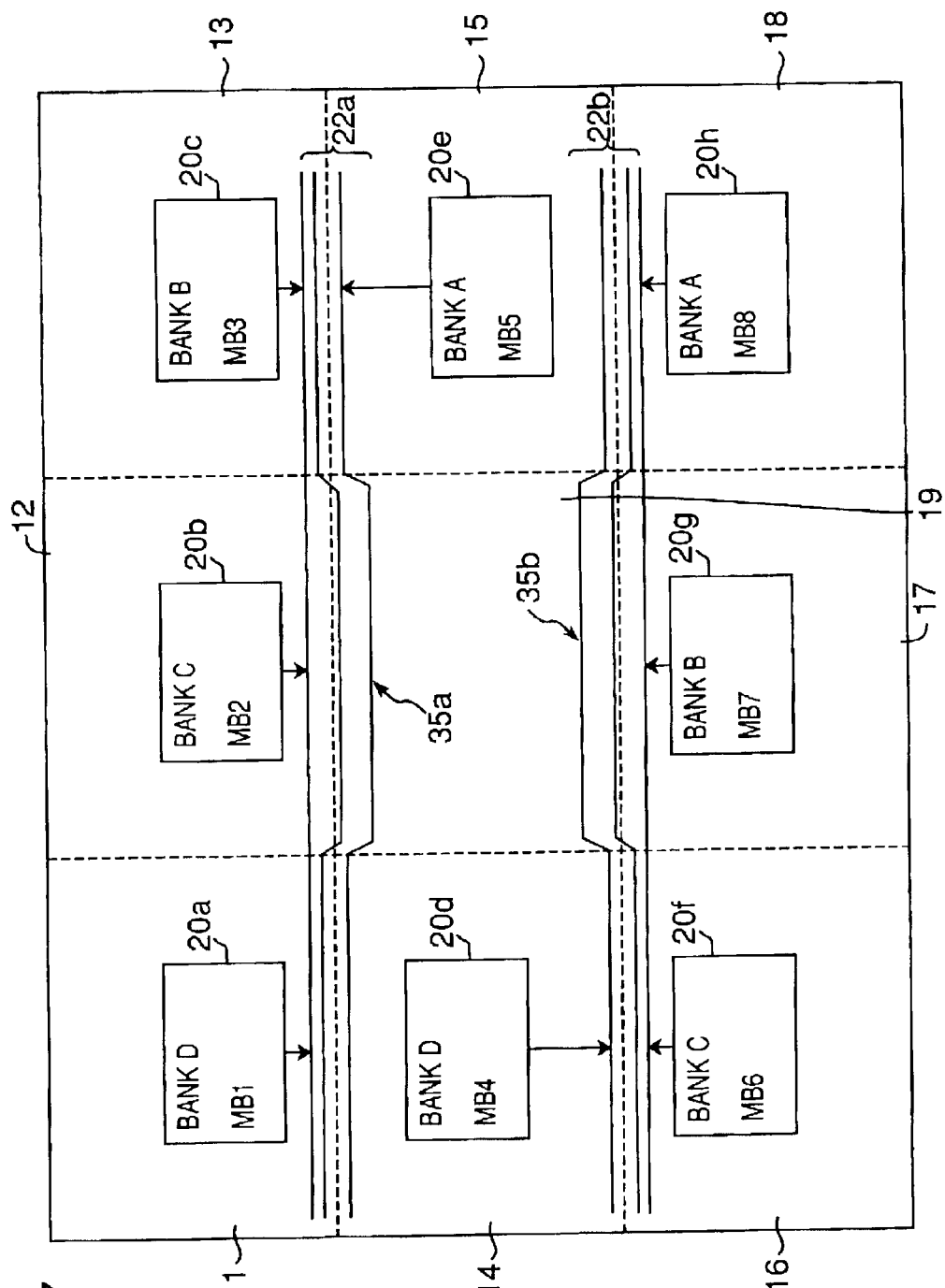
FIG. 7 is a schematic diagram showing the location of memory cell array according to a fourth embodiment of present invention.

Referring to FIG. 7, we will explain a semiconductor memory device according to a fourth embodiment of the present invention. The semiconductor memory device is different from the semiconductor memory device of the above mentioned embodiment in that each of the first and second data buses 22a, 22b have partially enlarged width and data lines partially spaced 35a, 35b at the center area. Thereby, a margin of data transfer speed may be enhanced so that a high-performance semiconductor memory device may be provided.

We will explain an effect of first and second data buses 22a, 22b having partially enlarged width and data lines partially spaced. A semiconductor memory device generally has data lines having shortened width and space between the data lines under the condition of layout area limitation. However, decrease of data lined width causes an increase in resistance. On the other hand, shortened space between data lines causes parasitic capacitance between adjacent data lines increasing. Since the resistance R of data lines and parasitic capacitance C between data lines are increased, the time constant RC determined by the resistance R and capacitance C is increased so that the data transfer speed may be decreased in the data bus. On the other hand, in the semiconductor memory device of the embodiment, each first and second data buses 22a, 22b has partially enlarged width and data lines partially spaced 35a, 35b adjacent the center area 19. Thereby, the resistance R and the capacitance C may be decreased. Then, the data transfer speed of each data bus 22a, 22b may be enhanced.

Figure 8:
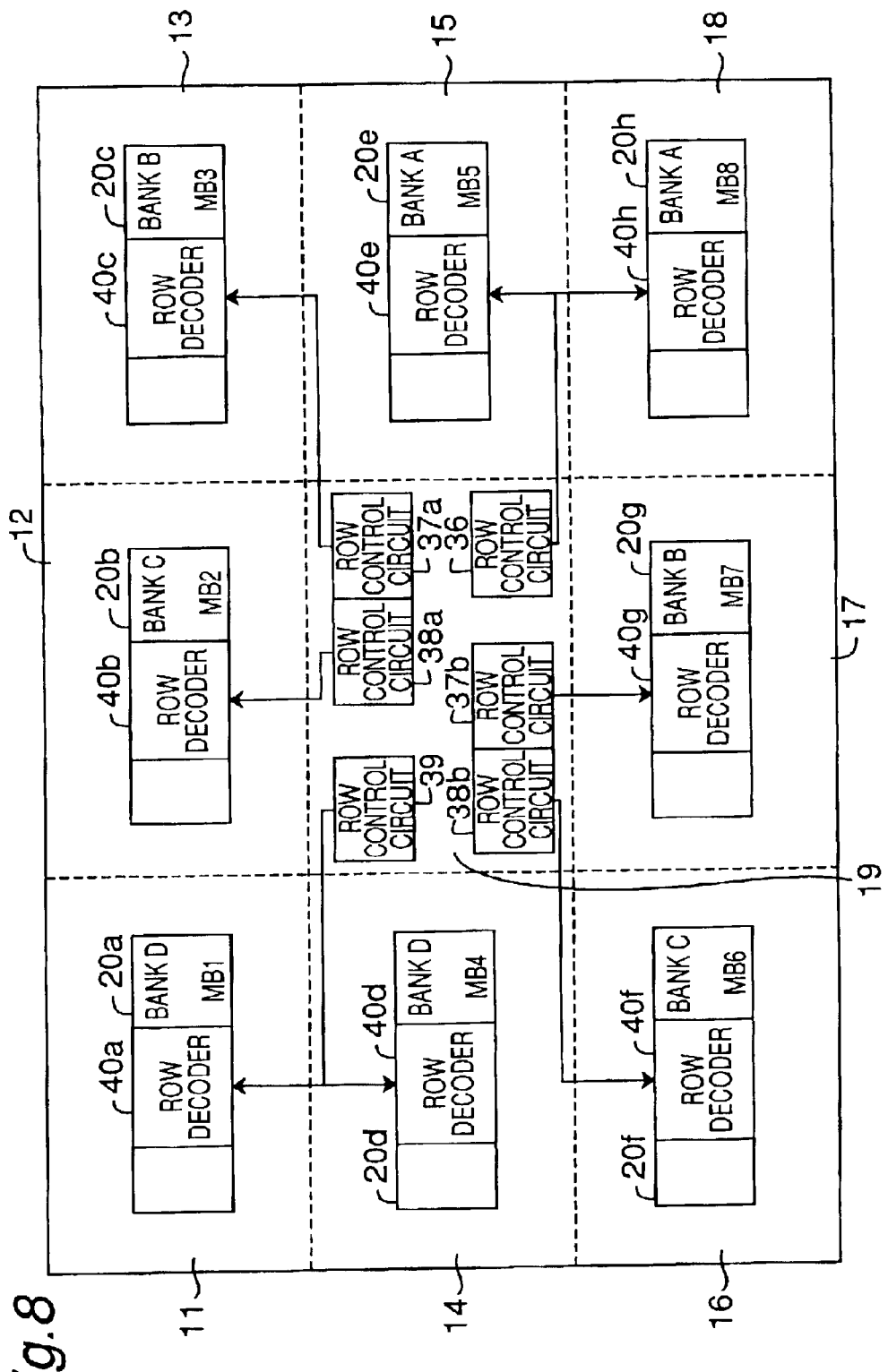
FIG. 8 is a schematic diagram showing the location of memory cell array according to a fifth embodiment of present invention.

Referring to FIG. 8, we will explain a semiconductor memory device according to a fifth embodiment. The semiconductor memory device has four banks each having a pair of memory blocks, such as BANK A (MB 5, MB 8), BANK B (MB 3, MB 7), BANK C (MB 2, MB 6), and BANK D (MB 1, MB 4) as shown in FIG. 8. The eight memory blocks MB1 to MB8 are arranged such that four line segments connected between a pair of memory blocks have no crossing. Specifically, the memory blocks of BANK A are arranged adjacently each other, and the memory blocks of BANK D too, as shown in FIG. 8. The memory blocks of BANK B are arranged at the first row and the third row respectively, and the memory blocks of BANK C too. Hereby, row control circuit and column control circuit may be connected to each memory block without crossing with respect to different bank. Then, the row control circuit and the column control circuit may be had in common each bank. Thereby, the row control circuit 36 to 39 for controlling row decoder 40 of memory block of each bank may be arranged within the center area 19 adjacent the memory block, so that control timing for four banks may be equalized each other. The memory blocks of BANK A have the row control circuit 36 in common, and the memory blocks of BANK D have the row control circuit 39 in common, so that the layout area may be reduced.

Figure 9:
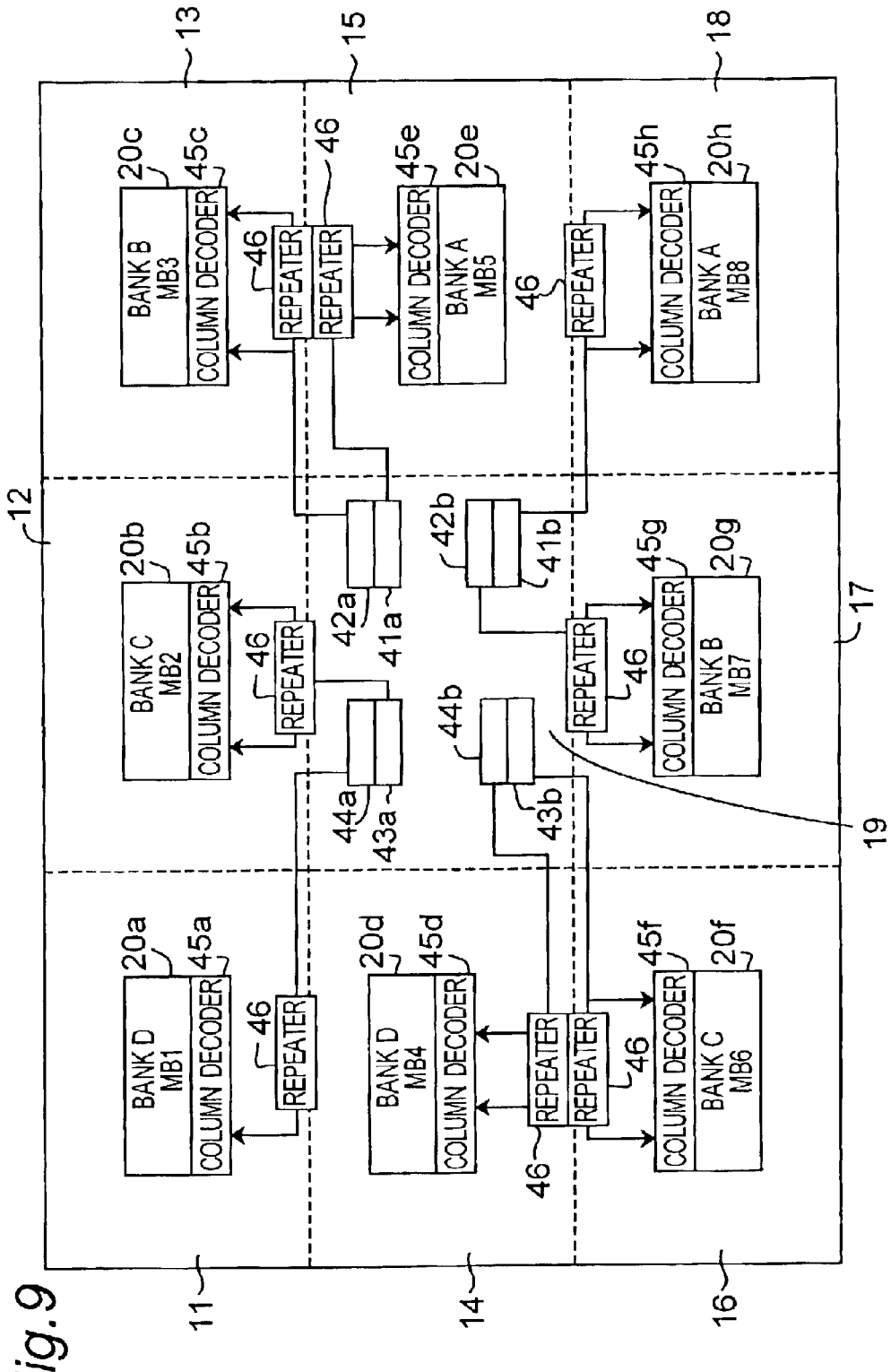
FIG. 9 is a schematic diagram showing the location of memory cell array according to a sixth embodiment of present invention.

Referring to FIG. 9, we will explain a semiconductor memory device according to a sixth embodiment. In the semiconductor memory device, column control circuits 41 to 44 controlling column decoder 45 of a pair of memory blocks of bank are arranged within the center area 19 adjacent the memory blocks as shown in FIG. 9. Hereby, delay of control signal may be minimized. Further, a repeater 46 is arranged between column control circuit 41 to 44 and column decoder 45. Thereby delay caused by weakened signal is reduced, then timing margin may be increased.

According to the semiconductor memory device of the present invention, the semiconductor memory device includes a first data bus having a plurality of data lines for lower side. The first data bus extends linearly between memory blocks in the first row of the matrix and memory blocks in the second row of the matrix. The semiconductor memory device also includes a second data bus having a plurality of data lines for upper side. The second data bus extends linearly between memory blocks in the second row of the matrix and memory blocks in the third row of the matrix. Thereby, the length of connection between the memory block and the data bus may be shortened, so that layout area may be reduced.

According to the semiconductor memory device of the present invention, The four memory blocks are for input/output to the data buffer, and are arranged adjacent both sides of the first data bus. On the other hand, the four memory blocks are for input/output to the data buffer, and are arranged adjacent both sides of the second data bus. Hereby, a length of connection between the memory block and the data bus may be shortened, so that layout area may be reduced.

According to the semiconductor memory device of the present invention, the four memory blocks having an even column address are arranged adjacent both sides of the first data bus. On the other hand, the four memory blocks having an odd column address are arranged adjacent both sides of the second data bus. Thereby, the semiconductor memory device may have reduced side length so that a semiconductor memory device having compact layout area may be fabricated.

According to the semiconductor memory device of the present invention, the semiconductor memory device includes a first data buffer connected to the first data bus, and a second data buffer connected to the second data bus, which are for data input/output from and to outside. The first and second data buffers are arranged within the center area. Since the first data buffer is arranged adjacent the first data bus, and the second data buffer is arranged adjacent the second data bus. Thereby data transfer speed may be enhanced so that the semiconductor memory device may have high performance.

According to the semiconductor memory device of the present invention, the first perpendicular bus is connected between the data buffer on lower side and the second data bus. The second perpendicular bus is connected between the data buffer on upper side and the first data bus. Hereby the semiconductor memory device, that is, a synchronous dynamic RAM may operate on double data rate DDR. Moreover, each of the first and second perpendicular buses is arranged within the center area, so that the semiconductor memory device may have reduced side length.

According to the semiconductor memory device of the present invention, the data bus equalizer circuit can effectively equalize each data bus, data transfer speed may be enhanced such that a high-performance semiconductor memory device may be provided.

According to the semiconductor memory device of the present invention, each first and second data buses have partially enlarged width and data lines partially spaced at the center area. Thereby, a margin of data transfer speed may be enhanced so that a high-performance semiconductor memory device may be provided.

According to the semiconductor memory device of the present invention, the eight memory blocks are arranged such that four line segments connected between a pair of memory blocks have no crossing. Hereby, row control circuit and column control circuit may be connected to each memory block without crossing with respect to different bank.

According to the semiconductor memory device of the present invention, the row control circuit for controlling row decoder of memory block of each bank may be arranged within the center area adjacent the memory block, so that control timing for four banks may be equalized each other.

According to the semiconductor memory device of the present invention, the memory blocks of bank have the row control circuit in common, and the memory blocks of bank have the row control circuit in common, so that the layout area may be reduced.

According to the semiconductor memory device of the present invention, column control circuits controlling column decoder of a pair of memory blocks of same bank are arranged within the center area adjacent the memory blocks. Hereby, delay of control signal may be minimized.

According to the semiconductor memory device of the present invention, the memory blocks of same bank have the column control circuit in common, and the memory blocks of the same bank have the column control circuit in common too, thereby layout area may be reduced.

According to the semiconductor memory device of the present invention, a repeater is arranged between column control circuit and column decoder. Thereby delay caused by weakened signal is reduced, then timing margin may be increased.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A semiconductor memory device comprising:
eight memory blocks arranged at respective eight of the total nine areas defined in a three rows by three columns matrix, except for a center area;
a first data bus having a plurality of data lines and linearly extending between memory blocks in the first row of the matrix and memory blocks in the second row of the matrix; and
a second data bus having a plurality of data lines and linearly extending between memory blocks in the second row of the matrix and memory blocks in the third row of the matrix,
wherein the eight memory blocks have a first group of the four memory blocks arranged adjacent the first data bus and connected to the first data bus and a second group of the four memory blocks arranged adjacent the second data bus and connected to the second data bus,
wherein the first data bus is for the memory block associated with a lower data buffer and the second data bus is for the memory block associated with an upper data buffer,
wherein the eight memory blocks have two groups each including four memory blocks associated with the lower data buffer or upper data buffer, the first group is positioned adjacent the first data bus and connected to the first data bus, and the second group is positioned adjacent the second data bus and connected to the second data bus.

2. A semiconductor memory device comprising:
eight memory blocks arranged at respective eight of the total nine areas defined in a three rows by three columns matrix, except for a center area;
a first data bus having a plurality of data lines and linearly extending between memory blocks in the first row of the matrix and memory blocks in the second row of the matrix; and
a second data bus having a plurality of data lines and linearly extending between memory blocks in the second row of the matrix and memory blocks in the third row of the matrix,
wherein the eight memory blocks have a first group of the four memory blocks arranged adjacent the first data bus and connected to the first data bus and a second group of the four memory blocks arranged adjacent the second data bus and connected to the second data bus,
wherein the first data bus is for the memory block having an even column address, and the second data bus is for the memory block having an odd column address,
wherein the eight memory blocks have two groups each including four memory blocks having the even or odd column address, the first group is arranged adjacent the first data bus and connected to the first data bus, and the second group is arranged adjacent the second data bus and connected to the second data bus.

3. A semiconductor memory device comprising:
eight memory blocks arranged at respective eight of the total nine areas defined in a three rows by three columns matrix, except for a center area;
a first data bus having a plurality of data lines and linearly extending between memory blocks in the first row of the matrix and memory blocks in the second row of the matrix;
a second data bus having a plurality of data lines and linearly extending between memory blocks in the second row of the matrix and memory blocks in the third row of the matrix,
a first data buffer arranged within the center area adjacent memory blocks in the first row of the matrix and connected to the first data bus;
a second data buffer arranged within the center area adjacent memory blocks in the third row of the matrix and connected to the second data bus;
a first perpendicular bus extending perpendicular to a longitudinal direction of the second data bus, the first perpendicular bus being connected between the second data bus and the first data buffer; and
a second perpendicular bus extending perpendicular to a longitudinal direction of the first data bus, the first perpendicular bus being connected between the first data bus and the second data buffer,
wherein the eight memory blocks have a first group of the four memory blocks arranged adjacent the first data bus and connected to the first data bus and a second group of the four memory blocks arranged adjacent the second data bus and connected to the second data bus.

4. A semiconductor memory device comprising:
eight memory blocks arranged at respective eight of the total nine areas defined in a three rows by three columns matrix, except for a center area;
a first data bus having a plurality of data lines and linearly extending between memory blocks in the first row of the matrix and memory blocks in the second row of the matrix; and a second data bus having a plurality of data lines and linearly extending between memory blocks in the second row of the matrix and memory blocks in the third row of the matrix, wherein the eight memory blocks have a first group of the four memory blocks arranged adjacent the first data bus and connected to the first data bus and a second group of the four memory blocks arranged adjacent the second data bus and connected to the second data bus, wherein each of the first and second data buses comprises a data bus equalizer.

5. A semiconductor memory device comprising:

eight memory blocks arranged at respective eight of the total nine areas defined in a three rows by three columns matrix, except for a center area;

a first data bus having a plurality of data lines and linearly extending between memory blocks in the first row of the matrix and memory blocks in the second row of the matrix; and a second data bus having a plurality of data lines and linearly extending between memory blocks in the second row of the matrix and memory blocks in the third row of the matrix, wherein the eight memory blocks have a first group of the four memory blocks arranged adjacent the first data bus and connected to the first data bus and a second group of the four memory blocks arranged adjacent the second data bus and connected to the second data bus, wherein the eight memory blocks include four banks each having a pair of memory blocks, the one memory block of the bank is connected to the first data bus, the other memory block is connected to the second data bus, wherein the eight memory blocks are arranged such that four line segments connected between a pair of memory blocks have no crossing, wherein each pair of memory blocks of the bank has a row controller for controlling the row decoder in common.

6. A semiconductor memory device comprising:

eight memory blocks arranged at respective eight of the total nine areas defined in a three rows by three columns matrix, except for a center area;

a first data bus having a plurality of data lines and linearly extending between memory blocks in the first row of the matrix and memory blocks in the second row of the matrix;

a second data bus having a plurality of data lines and linearly extending between memory blocks in the second row of the matrix and memory blocks in the third row of the matrix, a column decoder associated with a memory block; and a column controller for controlling the column decoder, the column controller being arranged within the center area adjacent the memory block, wherein the eight memory blocks have a first group of the four memory blocks arranged adjacent the first data bus and connected to the first data bus and a second of the four memory blocks arranged adjacent the second data bus and connected to the second data bus.

7. The semiconductor memory device according to claim 6, wherein a repeater circuit is arranged between the column controller and the column decoder.

* * * * *